United States Patent [19]

Kamimura et al.

[11] Patent Number: 4,941,489
[45] Date of Patent: Jul. 17, 1990

[54] CARRIER CLEANING AND DRYING APPARATUS

[75] Inventors: Yasuo Kamimura, Hachioji; Toshiaki Ohmori, Itami; Motonori Yanagi, Itami; Takaaki Fukumoto, Itami; Masaharu Hama, Itami, all of Japan

[73] Assignees: Dan Science Co., Ltd.; Mitsubishi Denki Kabushiki Kaisha, both of Japan

[21] Appl. No.: 402,988

[22] Filed: Sep. 5, 1989

Related U.S. Application Data

[63] Continuation of Ser. No. 190,336, May 5, 1988, abandoned.

[30] Foreign Application Priority Data

May 6, 1987 [JP] Japan ............... 62-67625[U]
May 6, 1987 [JP] Japan ............... 62-67626[U]

[51] Int. Cl.$^5$ ............................. B08B 3/02
[52] U.S. Cl. ........................... 134/95; 134/99; 134/144; 134/153
[58] Field of Search ............... 134/95, 99, 144, 153, 134/157, 172, 180, 181, 199, 200, 170

[56] References Cited

U.S. PATENT DOCUMENTS

| | | | |
|---|---|---|---|
| 3,411,518 | 11/1968 | Fisher et al. | 134/170 X |
| 3,446,219 | 5/1969 | Hilleman | 134/144 X |
| 3,624,750 | 11/1971 | Peterson | 134/153 X |
| 3,769,992 | 11/1973 | Wallestad | 134/153 X |
| 3,799,178 | 3/1974 | Anderson et al. | 134/172 X |
| 4,165,994 | 8/1979 | Jackson | 134/153 X |
| 4,299,245 | 11/1981 | Clapper | 134/144 X |

*Primary Examiner*—Philip R. Coe
*Attorney, Agent, or Firm*—Leydig, Voit & Mayer

[57] ABSTRACT

A carrier cleaning and drying apparatus for cleaning and drying a wafer processing carrier has a cleaning tank for accommodating the carrier and a high-pressure injection nozzle disposed in an upper portion of the cleaning tank and for injecting a pressurized cleaning solution. This high-pressure injection nozzle is moved within a plane and the cleaning solution is injected at high pressure therefrom, thereby removing dust adhering to the inner and outer surfaces of the carrier by means of the force of injection. A supporting and rotating mechanism portion is also provided which, during cleaning of the carrier, swings the carrier at a predetermined angle, and, after cleaning, effects drying by spinning the carrier at high speed.

9 Claims, 2 Drawing Sheets

CARRIER CLEANING AND DRYING APPARATUS

This application is a continuation of application Ser. No. 07/190,336, filed May 5, 1988, and now abandoned.

BACKGROUND OF THE INVENTION

1. Field of the Invention

The present invention relates to a carrier cleaning and drying apparatus for cleaning and drying a wafer processing carrier which accommodates semiconductor wafers in the process of manufacturing semiconductor devices.

2. Description of the Related Art

In the field of manufacturing semiconductor devices, an apparatus shown in FIGS. 1 and 2 is conventionally known as a carrier cleaning and drying apparatus for cleaning and drying a carrier which is used for processing wafers. FIG. 1 illustrates an internal structure of a cleaning tank for cleaning the carrier, while FIG. 2 illustrates an internal structure of a drying tank for drying the cleaned carrier. When the carrier is cleaned, a carrier 1 is secured on and supported by a supporting mechanism portion 3 in a cleaning tank shown in FIG. 1. This carrier 1 has a box-like configuration in which upper and lower portions thereof are open, as shown in FIG. 3. A semiconductor wafer 1a is accommodated therein. The carrier 1 placed on a supporting portion 3a of the supporting mechanism portion 3 is pressed by a pair of retaining rods 3b from both sides, and each tip portion of the retaining rod 3b engages a groove portion 1b of the carrier 1 so as to secure and support the carrier 1 on the supporting portion 3a. The retaining rod 3b pivots about a fulcrum 3d and normally presses against the outside of the carrier 1 by means of the force of a tension spring 3c to support the carrier 1. To remove the carrier 1 from the supporting mechanism portion 3, a release button is pressed inwardly to incline the distal end side of the retaining rod 3b, allowing the carrier 1 to be removed. The carrier 1 accommodated in the cleaning tank 2 is cleaned by a shower of a cleaning solution injected from a plurality of shower nozzles 4 provided on inner walls of the cleaning tank 2 and by means of a rotary brush 5 which moves vertically along an inner surface of the carrier 1 while rotating. The supporting portion 3a is arranged such that the cleaning solution injected from the shower nozzles 4 flows out through a discharge port 2a of the cleaning tank 2.

Upon completion of cleaning, the carrier 1 is transferred to a drying tank 6 shown in FIG. 2. The drying tank 6 has a supporting and rotating mechanism portion 8 for rotating while the carrier 1 is secured and supported and to effect drying by means of centrifugal force, as well as an electric heater 7 for promoting drying. The carrier 1 which is secured to and supported by the supporting and rotating mechanism 8 is fitted in a receiving portion 8f up to the portion designated at 1c in FIG. 3. The retaining rods 8b are each pivoted about a fulcrum 8d and press against the outside of the carrier 1 by means of the force of the tension spring 8c to secure and support the carrier. A rotary shaft is coupled with a power source 8h such as a motor to rotate the carrier 1. On the side of a rotary shaft 8a opposite to the carrier 1 a counterweight 8g is disposed for balancing during rotation. In addition, this drying tank 6 has a cover portion 6b at the top thereof and a discharge port 6a at the bottom thereof. The carrier 1 is rotated about the rotational shaft 8a, and droplets of water attached to the carrier 1 are flung by centrifugal force and the carrier 1 is thus dried. At the same time, the drying speed is accelerated by the electric heater 7 provided on the inner side walls of the drying tank 6. The carrier 1 can be removed from the supporting and rotating mechanism portion 8 by pressing a release button 8e inwardly.

The conventional carrier cleaning and drying apparatus is arranged as described above. However, there has been the problem that, since the rotary brush simply moves vertically, the outer surfaces of the carrier cannot be cleaned although the inner surfaces of the carrier can be cleaned. In addition, since the rotary brush is moved vertically while being rotated, there has been the drawback that its structure becomes complicated. Furthermore, since the cleaning tank and the drying tank are juxtaposed, a wide space is required for installation, so that this type of apparatus is unsuitable particularly when production is effected on a small scale, and it is inconvenient to operate.

SUMMARY OF THE INVENTION

Accordingly, it is an object of the present invention to provide a carrier cleaning and drying apparatus which is capable of cleaning both inner and outer surfaces of a carrier, that has a simple structure, and that requires a small installation space.

In the carrier cleaning and drying apparatus according to the present invention, a high-pressure injection nozzle for injecting a pressurized cleaning solution is provided in an upper portion of a cleaning tank. This high-pressure injection nozzle is moved within a plane, thereby making it possible to remove dust adhering to the inner and outer surfaces of the carrier by means of the force of injection.

In addition, to prevent the inner and outer surfaces of the carrier from being recontaminated by injection cleaning with the high-pressure injection nozzle, a shower nozzle is provided on an inner wall surface of a cleaning tank to effect cleaning. Recontamination of the inner and outer surfaces of the carrier means residual foams on the surfaces of the carrier from the high pressure spraying of a cleaning solution.

Furthermore, in addition to the high-pressure injection nozzle being moved within a plane, a swinging mechanism for swinging the carrier may also be provided.

In the carrier cleaning and drying apparatus according to this invention, a supporting and rotating mechanism portion is provided which, at the time of cleaning the carrier, swings the carrier within an angle of a predetermined range, and, after the cleaning, effects drying by spinning the carrier at high speed, to allow cleaning and drying to be carried out in one tank.

The above and other objects, features and advantages of the present invention will become apparent from the following detailed description of the present invention when read in conjunction with the accompanying drawings.

Figure 1:
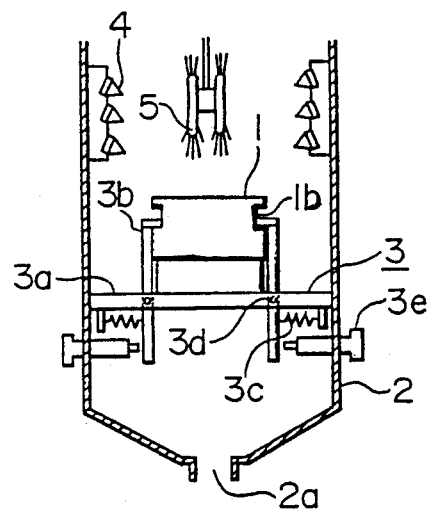
FIG. 1 is a vertical cross-sectional view illustrating the internal structure of a cleaning tank in a conventional carrier cleaning and drying apparatus.
Figure 4:
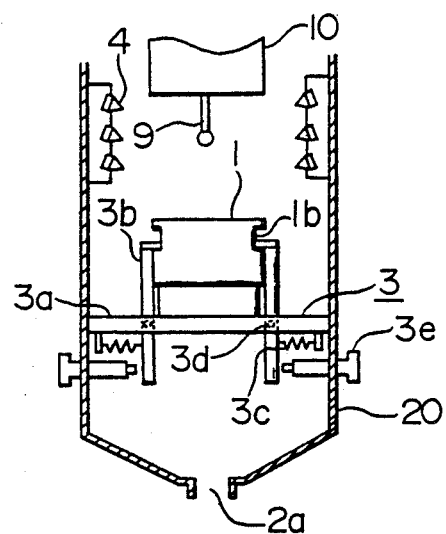
FIG. 4 is a vertical cross-sectional view illustrating the internal structure of a cleaning tank of a carrier cleaning and drying apparatus in accordance with an embodiment of the present invention.

DESCRIPTION OF THE PREFERRED EMBODIMENTS:

FIG. 4 is a vertical cross-sectional view illustrating an internal structure of a cleaning tank of a carrier cleaning and drying apparatus in accordance with an embodiment of the present invention. During cleaning of a carrier 1, the carrier 1 is secured to and supported by a supporting mechanism portion 3 inside a cleaning tank 20. This supporting mechanism portion 3 is arranged in the same way as the conventional one shown in FIG. 1. A plurality of shower nozzles 4 are provided on internal side walls of the cleaning tank 20. In addition, disposed above the cleaning tank 20 is a high-pressure injection nozzle 9 for injecting a cleaning solution at high pressure. An X-Y drive controller 10 which controls the movement of this high-pressure injection nozzle 9 in a plane so that the injected cleaning solution is applied uniformly to the inner and outer surfaces of the carrier 1. During cleaning of the carrier 1, the cleaning solution pressurized to approximately 30 kg/cm$^2$ is injected from the high-pressure injection nozzle 9. At this time, the high-pressure injection nozzle 9 is made to travel within a plane by means of the X-Y drive controller 10 so that the cleaning solution injected at high pressure applied to all the portions of the inner and outer surfaces of the carrier 1 (see FIG. 1). Dust adhering to the inner and outer surfaces of the carrier 1 is removed by the pressure of the cleaning solution injected at high pressure. In addition, a shower is sprayed from the shower nozzles 4 provided on the inner side walls of the cleaning tank 20 to clean the surfaces of the carrier 1 so that recontamination due to the high-pressure injection will not result. Incidentally, when ultra-pure water (one generally used as a cleaning solution in the field of manufacture of semiconductor devices) is used as the cleaning solution and is injected at high pressure, the carrier 1 is charged with electricity and causes recontamination. Hence, it is preferable to lower the resistance of the cleaning solution to 0.1 MΩ or below.

The high-pressure cleaning solution from the high-pressure injection nozzle 9 may fail to reach some portions of the surfaces of the carrier 1 if the high-pressure injection nozzle 9 merely travels in a plane to effect injection. Then an arrangement may be made to inject at high pressure the cleaning solution from the shower nozzles 4 provided on the inner side walls of the cleaning tank.

Figure 2:
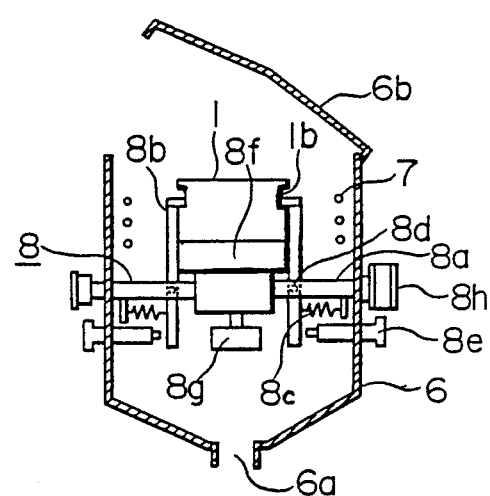
FIG. 2 is a vertical cross-sectional view illustrating the internal structure of a drying tank in the conventional carrier cleaning and drying apparatus.
Figure 3:
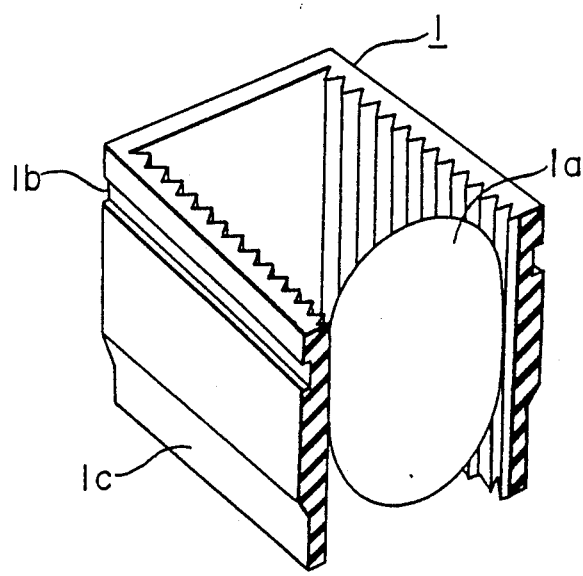
FIG. 3 is a perspective view illustrating a structure of a carrier for processing semiconductor wafers.

Upon completion of cleaning, the carrier 1 is transferred to a drying tank 6 which is arranged in the same way as the conventional one, as shown in FIG. 2, and drying is effected in the same way as in the conventional manner.

Figure 5:
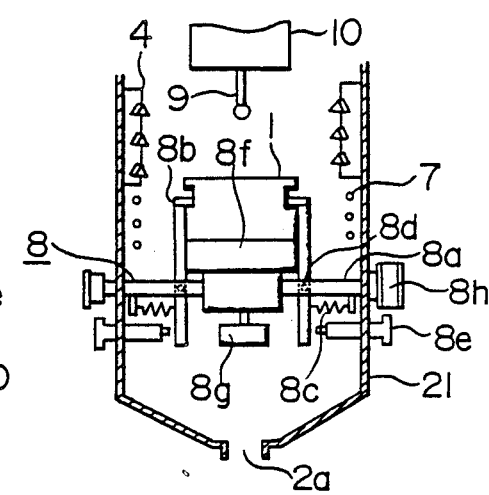
FIG. 5 is a vertical cross-sectional view illustrating an internal structure of a cleaning and drying tank in accordance with another embodiment of the present invention which is capable of effecting cleaning and drying in one tank.
Figure 6:
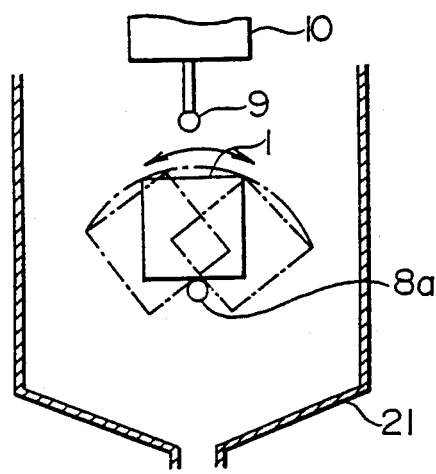
FIG. 6 is a diagram illustrating the swinging operation of a supporting and rotating mechanism portion.

In addition, in another embodiment of the present invention, the high-pressure injection nozzle travels in a plane, and, at the same time, the carrier is made to swing. FIGS. 5 illustrates a cleaning tank 21 which is used in that case. The tank 21 has a supporting and rotating mechanism portion 8 which is also capable of performing a swinging operation. The carrier 1 is secured on and supported by the supporting and rotating mechanism portion 8. This supporting and rotating mechanism portion 8 may be the same as the supporting and rotating mechanism portion 8 provided in the conventional drying tank 6 shown in FIG. 2. In FIG. 5, the carrier 1 is made to swing about the rotational shaft 8a of the carrier 1 through an angle of about 90 degrees, by means of the supporting and rotating mechanism portion 8, as indicated by the phantom lines in FIG. 6. At the same time, while the high-pressure injection nozzle 9 is traveling in a plane, the pressurized cleaning solution is injected from the high-pressure injection nozzle 9 toward the carrier 1. Consequently, the dust adhering to the entire inner and outer surfaces of the carrier 1 can be removed.

Figure 7:
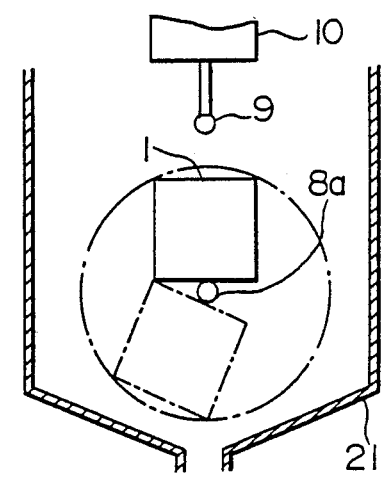
FIG. 7 is a diagram illustrating the rotational operation of the supporting and rotating mechanism portion.

In addition, the supporting and rotating mechanism portion 8 in the tank 21 shown in FIG. 5 may be arranged such that the carrier 1 can be rotated about the rotational shaft 8a, as shown by the phantom lines in FIG. 7. Accordingly, after completion of cleaning, the supporting and rotating mechanism portion 8 can be changed over from the swinging motion to the rotational motion. Without the carrier 1 being transferred to the drying tank it is made to spin at about 400 to 600 r.p.m. to drain water and effect drying. At that juncture, to accelerate the drying of the carrier 1, an arrangement may be provided such that nitrogen gas (N$_2$) or dry air is injected from the high-pressure injection nozzle or the shower nozzles 4 toward the carrier 1 during spinning, or the electric heater 7, provided in the cleaning tank 21, as shown in FIG. 5 may be energized. In this case, since the cleaning and drying of the carrier can be effected in one tank, it is possible to provide a carrier cleaning and drying apparatus which occupies only a small installation space and is suitable to the manufacture of semiconductor devices on a small scale.

What is claimed is:

1. An apparatus for cleaning and drying a wafer processing carrier comprising:

a cleaning tank having at least one side wall and upper and lower portions for accommodating a wafer processing carrier;

a high-pressure injection nozzle disposed in the upper portion of said cleaning tank for injecting a cleaning solution toward the wafer processing carrier in said cleaning tank at high pressure;

means for supporting the wafer processing carrier in said cleaning tank and for swinging the wafer processing carrier through an arc while the cleaning solution is being injected toward the wafer processing carrier;

means for moving said high-pressure injection nozzle within said cleaning tank while the cleaning solution is being injected toward the wafer processing carrier; and a shower nozzle disposed on said side wall of said cleaning tank for spraying the cleaning solution on said carrier.

2. An apparatus according to claim 1 wherein said means for supporting the wafer processing carrier in said cleaning tank includes means for spinning the carrier about an axis at high speed, after injection and spraying of the cleaning solution has ceased, to dry the carrier.

3. An apparatus according to claim 2 including said shower nozzle for spraying a gas at the carrier, after injection and spraying of the cleaning solution has ceased, to accelerate drying of the carrier.

4. An apparatus according to claim 2 including a heater mounted on said side wall of said cleaning tank for accelerating drying of the carrier.

5. An apparatus for cleaning and drying a wafer processing carrier comprising:
- a cleaning tank having at least one side wall and upper and lower portions for accommodating a wafer processing carrier;
- a high-pressure injection nozzle disposed in the upper portion of said cleaning tank for injecting a cleaning solution toward the wafer processing carrier in said cleaning tank at high pressure;
- x-y drive means for controllably moving said high-pressure injection nozzle in two dimensions within a plane within said cleaning tank while the cleaning solution is being injected therethrough, thereby to inject the cleaning solution toward all portions of the wafer processing carrier; and
- a shower nozzle disposed on said side wall of said cleaning tank for spraying the cleaning solution on said carrier.

6. An apparatus according to claim 5 comprising means for supporting the wafer processing carrier in said cleaning tank and for swinging the wafer processing carrier through an arc while the cleaning solution is being injected toward the wafer processing carrier.

7. An apparatus according to claim 5 comprising means for supporting the wafer processing carrier in said cleaning tank, for swinging the wafer processing carrier through an arc while the cleaning solution is being injected toward the wafer processing carrier, and for spinning the carrier about an axis at high speed, after injection and spraying of the cleaning solution has ceased, to dry the carrier.

8. An apparatus according to claim 7 including said shower nozzle for spraying a gas at the carrier, after injection and spraying of the cleaning solution has ceased, to accelerate drying of the carrier.

9. An apparatus according to claim 7 including a heater mounted on said side wall of said cleaning tank for accelerating drying of the carrier.

* * * * *